United States Patent [19]
Hubsch et al.

[11] 4,119,483
[45] Oct. 10, 1978

[54] METHOD OF STRUCTURING THIN LAYERS

[75] Inventors: Hubertus Hübsch, Hamburg; Ursula Convertini, Borstel-Hohenraden; Heinz Dimigen, Hamburg; Holger Lüthje, Halstenbek, all of Germany

[73] Assignee: U.S. Philips Corporation, New York, N.Y.

[21] Appl. No.: 766,662

[22] Filed: Feb. 8, 1977

Related U.S. Application Data

[63] Continuation of Ser. No. 590,969, Jun. 25, 1975, abandoned.

[30] Foreign Application Priority Data

Jul. 30, 1974 [DE] Fed. Rep. of Germany ....... 2436568

[51] Int. Cl.² .......................... B44C 1/22; B29C 17/08
[52] U.S. Cl. .................................... 156/655; 156/668; 427/264
[58] Field of Search ............... 427/259, 264, 272, 282; 96/36.2, 38.3, 38.4; 156/654–657, 668, 904; 204/192 EC

[56] References Cited

U.S. PATENT DOCUMENTS

| | | | |
|---|---|---|---|
| 3,443,915 | 5/1969 | Wood et al. | 96/38.3 X |
| 3,567,508 | 3/1971 | Cox et al. | 96/36.2 X |
| 3,723,277 | 3/1973 | Schmiedecke | 204/192 EC |

*Primary Examiner*—William A. Powell
*Attorney, Agent, or Firm*—Frank R. Trifari

[57] ABSTRACT

A method of structuring oxide layers, nitride layers or magnetic layers in such manner that a photolacquer mask is manufactured on a substrate and the layer to be structured is provided by means of cathode sputtering both on the photolacquer mask and on the surfaces of the substrate not covered with lacquer. The substrate is then treated with a solvent attacking the lacquer mask; the mask swells up and the parts of the layer to be structured present thereon are chipped off. In order to stimulate this latter process, a layer is provided below the photolacquer mask on the substrate relative to which photolacquer has a small adhesive capacity and, after providing the layer to be structured, an increase in volume of the lacquer mask is produced by thermal treatment. After the complete removal of the photolacquer mask and the parts of the layer to be structured present thereon, the structured thin layer remains on the substrate as a negative of the pattern of the photolacquer mask.

15 Claims, 11 Drawing Figures

METHOD OF STRUCTURING THIN LAYERS

This is a continuation of application Ser. No. 590,969, filed June 25, 1975, now abandoned.

The invention relates to a method of structuring thin layers in which the layer to be structured is provided on a substrate masked locally by a layer of photolacquer and is removed again partly by removing the layer of photolacquer.

Such methods are already known and are used in thin-layer-technology, for example, in manufacturing masks for integrated circuits.

It is already known (GDR-Pat. No. 72068) to manufacture $SiO_2$ masks on a semiconductor substrate in such manner that a photolacquer mask is formed on the substrate by means of photolithographic processes and a layer of silicon oxide or silicon nitride is provided by means of cathode sputtering in a gas discharge both on the photolacquer mask and on the surfaces of the semiconductor substrate not covered with lacquer. The substrate is then treated with a solvent which attacks the lacquer mask; the photolacquer mask swells up and the parts of the layer of silicon oxide or silicon nitride present thereon are removed by chipping off. After removing the photolacquer mask, the desired silicon oxide or silicon nitride mask remains on the semiconductor substrate as a negative of the pattern of the photolacquer mask.

It has been found that this known method exhibits drawbacks in the cases in which very finely structured layers having layer thicknesses of more than 1 $\mu$m are to be formed on a substrate. According to the known method, structured layers of this type cannot be manufactured with the desired reproducibility. In other words: the yield of fully, accurately proportioned and perfectly structured layers on a substrate in comparison with the pattern of the mask is not high enough. "Full" structuring is to be understood to mean that all the surfaces on the substrate to be exposed are exposed indeed in a reproducible manner, while the "perfect" structuring relates in particular to the quality of the edges of the profile formed in the layer to be structured. It is of importance especially with a view to series production to be able to manufacture layers of the said kind with always the same quality and with a great precision. Inaccuracies in the profile, for example, have a particularly disadvantageous effect in forming structured multilayers.

The invention is based on the recognition that the reproducibility and the yield, respectively, depend on the quality of the surface on which the layer of photolacquer is provided and on which the layer to be structured is provided in the places not covered with lacquer: this surface should be such that the photolacquer has only a small adhesive capacity with respect to that.

The invention is furthermore based on the recognition that the chipping off process of the parts of the layer to be structured present on the photolacquer can be stimulated by volume variations of the layer of photolacquer which can be obtained, for example, by temperature influences.

It is thus an object of the invention to provide an improved method of obtaining very fine structures in thin layers of different materials.

The method of the kind mentioned in the preamble is therefore characterized according to the invention in that a layer is provided directly on the substrate (1) as a supporting layer (2) for the layer of photolacquer (3) and for the layer (4) to be structured with respect to which photolacquer, in the subsequent thermal treatment, has only a small adhesive capacity and that the substrate, after providing the layer to be structured, is heated in such a temperature range that the chemical reaction capacity of the photolacquer is just not yet detrimentally influenced and the photolacquer is removed.

The advantages resulting from the use of the invention consist in particular in that fully, accurately proportioned, structured layers having a good profile quality with respect to the mask can be obtained in a readily reproducible yield. The layer thicknesses of the layers to be structured are preferably in the range from approximately 1 to 3 $\mu$m; however, they may also be larger. The layer thicknesses of the layers to be structured are limited in the first instance by the possibility of providing correspondingly thick photolacquer layers.

The invention will now be described in greater detail with reference to an embodiment and the accompanying drawings, in which.

In the example below, there is described the manufacture of a structured aluminium layer which may be used, for example, as a layer of conductor tracks on a substrate, said aluminium tracks being 5 $\mu$m wide and approximately 20 mm long and being present at a distance of 5 $\mu$m from each other. The thickness of the aluminium tracks should be approximately 1 $\mu$m. In the same manner, layers of a different quality can also be structured, for example, titanium layers, magnetic layers for mass memories or thin-film-magnetic heads or layers of oxides and nitrides which are used as diffusion masks, oxidation masks, diffusion sources, dielectrics or passivating layers in planar semiconductor technology.

Figure 1A:
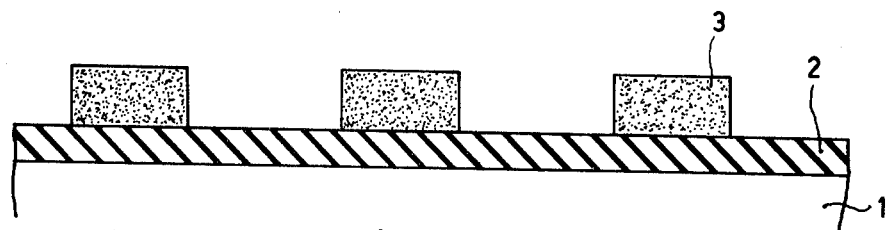
FIGS. 1a - 1c are cross-sectional views of a substrate in various stages of the method.
Figure 1B:
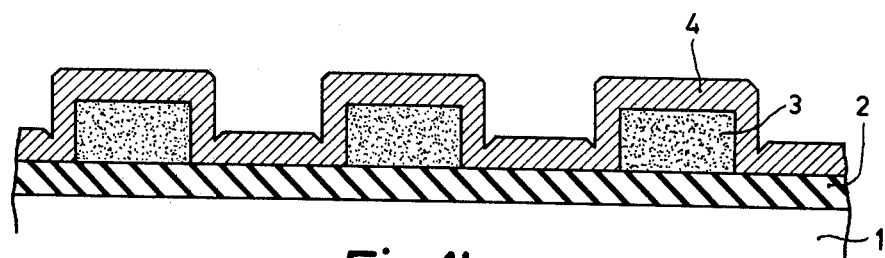

On a substrate 1 (FIG. 1a) a supporting layer 2 is provided to which photolacquer does not readily adhere. $SiO_2$ and aluminium have proved to be particularly suitable as a material for such layers. In the case of a silicon substrate, an $SiO_2$ layer can be formed by thermal oxidation; however, the layers may equally readily be formed, for example, by cathode sputtering in the gaseous phase or by vapour deposition. On the substrate 1 having the supporting layer 2 a masking photolacquer layer 3 having steep edges is then provided by means of the known photolithographic methods, the photolacquer mask being the negative of the structured layer to be formed. Both a positive and a negative lacquer may be used for the manufacture of the photolacquer layer 3. For the present embodiment Shipley (AZ 135 OH) was used as the positive photolacquer in a thickness of approximately 3 $\mu$m. At any rate the thickness of the photolacquer layer must be larger than the thickness of the layer to be structured. The photolacquer layer 3 after providing and developing, may no longer be heated so as not to influence the steepness of the edges disadvantageously. After providing the photolacquer layer, a 1 μm thick layer 4 of aluminium is provided on the cooled substrate 1 having the supporting layer 2 and the photolacquer layer 3 by means of high frequency cathode sputtering in a gas discharge (preferably in Argon) (FIG. 1b). The substrate is then heated for 30 minutes at 130° C.

The practical results have demonstrated that such a temperature treatment considerably stimulates the chipping off process of the parts of the layer to be structured present on the photolacquer layer. This may be a result of the fact that due to expansion of the photolacquer, as a result of thermal expansion or by giving off of solvent residues still present in the lacquer, the cracking or at least the formation of cracks in the layer to be structured is stimulated. The temperature should be as high as possible and be at any rate above the flow limit of the photolacquer but on the other hand may not be so high that as a result of this a further "cross linking" of the photolacquer is produced and hence the solubility thereof in an associated solvent is reduced.

Figure 2:
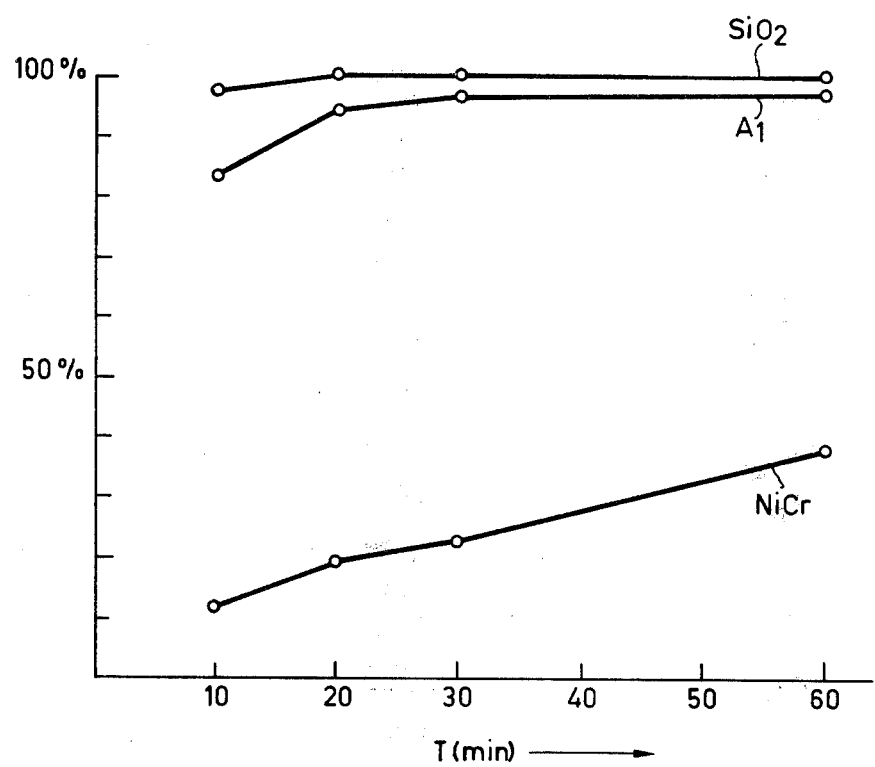
FIG. 2 is a graph showing the yield of perfectly and fully structured layers as a function of the quality of the surface of the substrate and of the duration of the thermal treatment.

How great the importance of the quality of the surface of the substrate on which the photolacquer layer and the layer to be structured as provided is for the yield of perfectly and fully structured layers, appears from the following table and from FIG. 2. The surface of the substrate should have such a quality that the photolacquer layer does not readily adhere to it. When an $SiO_2$ layer was formed on a silicon substrate by thermal oxidation, the yield was much better than when, for example, a chromium-nickel layer was provided on the substrate as a supporting layer for the photolacquer layer and the layer to be structured.

The favorable effects when using an $SiO_2$ layer as a supporting layer also become apparent from the Example in which a chromium-nickel layer on the substrate was covered with a further $SiO_2$ layer which in turn then formed the supporting layer for the photolacquer layer and the layer to be structured.

| Surface of the substrate | Yield (%) |
|---|---|
| silicon substrate having $SiO_2$ supporting layer | 98 |
| silicon substrate having chromium-nickel supporting layer (0.1 /μm) | 45 |
| silicon substrate having a chromium-nickel intermediate layer (0.1 /μm) and an $SiO_2$ supporting layer (0.1 /μm) | 96. |

Figure 1C:
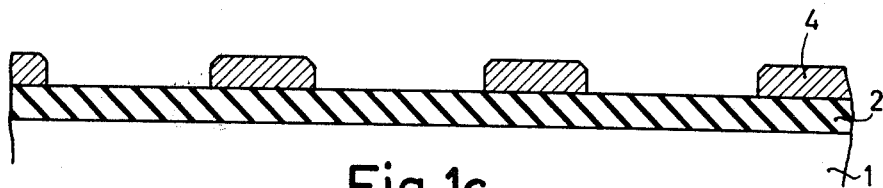

After the temperature treatment of the substrate 1 having the photolacquer layer 3 and the layer 4 to be structured, the substrate is dipped in a solvent which dissolves the photolacquer. Such a solvent may be, for example, acetone. As a result of diffusion through the layer 4 to be structured, the solvent dissolves the photolacquer present below the layer and causes it to swell up. The treatment can be accelerated by ultrasonic effects. The swelling photolacquer 3 causes the parts of the layer 4 to be structured present thereon to be removed, the remaining parts of the layer 4 to be structured remaining on the substrate 1 having the supporting layer 2 after the complete removal of the photolacquer (FIG. 1c).

According to the principle described, multi-layers can also be structured which are built up from layers of different materials, for example, an insulating material and a material for conductor tracks. Such multilayers are of importance, for example, for the construction of integrated magnetic memories.

Figure 3A:
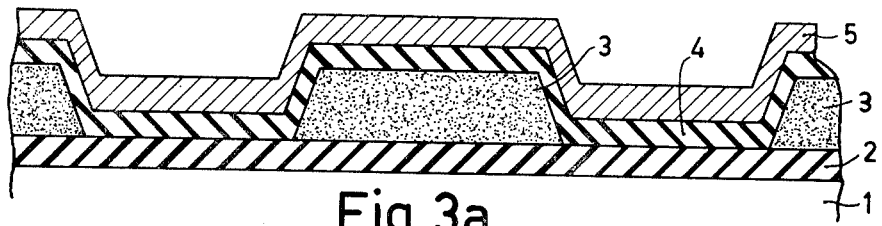
FIGS. 3a - 3f are cross-sectional views of a substrate having multi-layers in various stages of the method.
Figure 3B:
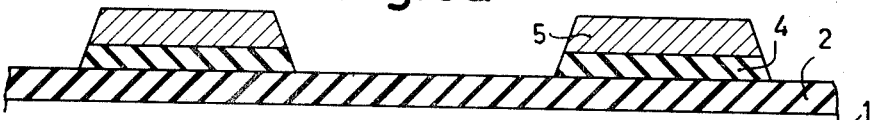
Figure 3C:
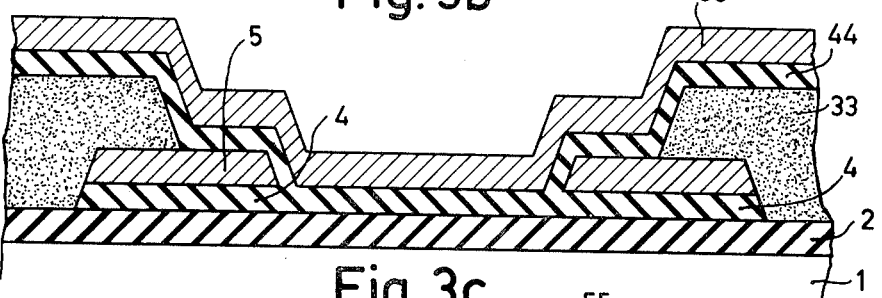
Figure 3D:
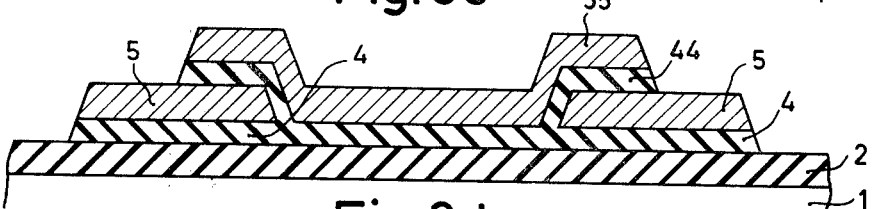
Figure 3E:
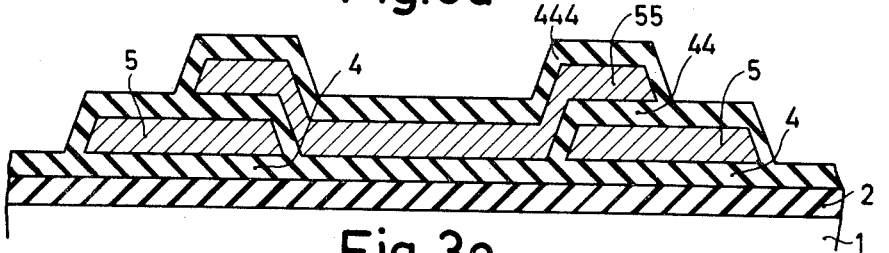
Figure 3F:
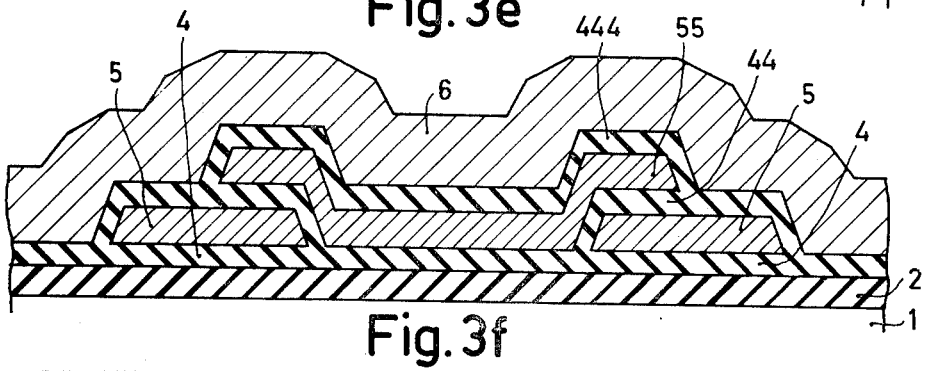

FIG. 3a is a cross-sectional view of a substrate 1 having a supporting layer 2, in this case in the form of a magnetic layer of FeSi, a photolacquer layer 3 covering the supporting layer 2 partly, an $SiO_2$ layer 4 provided by cathode sputtering and an aluminium layer 5 provided on said $SiO_2$ layer 4 by cathode sputtering. After removing the photolacquer layer 3, the substrate 1 covered with a double layer having the supporting layer 2, the $SiO_2$ layer 4 and the aluminium layer 5 is obtained as is shown in FIG. 3b. These successive layers shown in FIG. 3b can now be provided again with an insulating layer and a layer of conductor tracks; the stage shown in FIG. 3c is then obtained, in which on the substrate 1 with the first layer structure 4 and 5 a further photolacquer layer 33 is provided and a further $SiO_2$ layer 44 and a further aluminium layer 55 are provided by cathode sputtering. After removing the photolacquer layer 33 the substrate 1 with the supporting layer 2 and the double layer structures 4, 5 and 44, 55 is obtained as is shown in FIG. 3d. A third $SiO_2$-layer 444 as an insulating layer (FIG. 3e) may be provided on said multiple-structured successive layers in a further process step by cathode sputtering, which insulating layer may then be provided, for example by electroless plating, with a magnetic covering layer, for example, of nickel-iron (FIG. 3f). The magnetic coupling between the magnetic supporting layer 2 and the magnetic covering layer 6 is not shown in the figures.

The steepness of the edges of the structured photolacquer layer is of great importance in the method described; in addition the photolacquer layer should show sides which are rounded off as little as possible. For example, a thermal treatment of a photolacquer layer prior to providing the layer to be structured results in flattening of the angle of inclination of the edges and in rounding of the sides.

Figure 4:
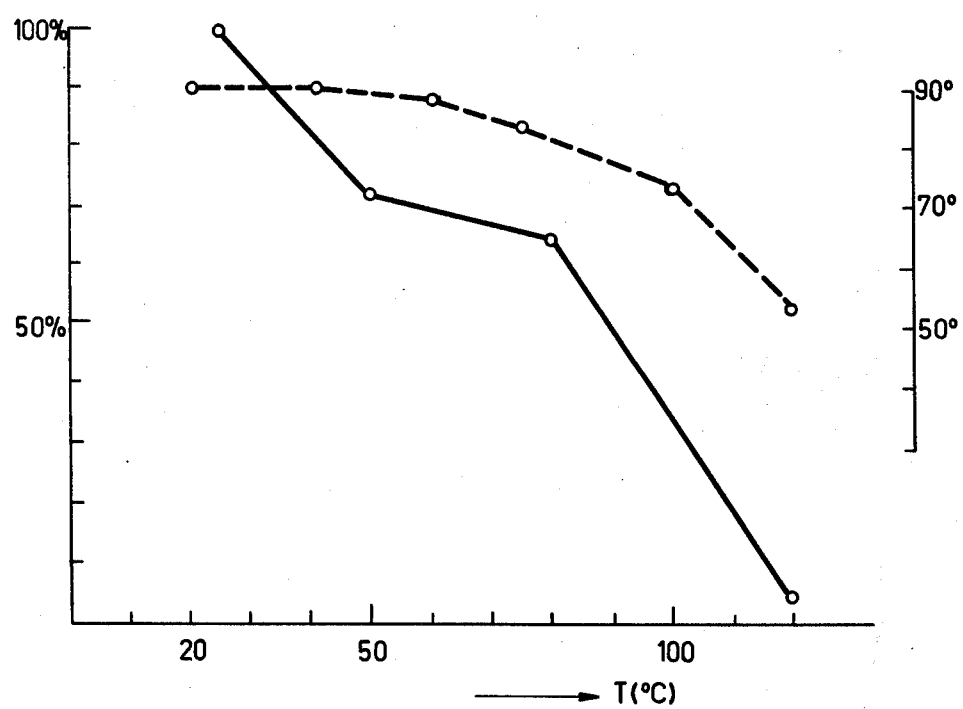
FIG. 4 shows the yield of perfectly and fully structured layers and the angle of inclination of the edges of the layer of photolacquer as a function of the baking temperature of the lacquer mask.

FIG. 4 shows the yield of perfectly and fully structured thin layers, (solid line) and the angle of the edges as a function of the baking temperature of the lacquer mask (broken line).

What is claimed is:
1. A method of providing a structure comprising a certain thin layer, comprising the steps of:
   (a) providing a substrate having a surface;
   (b) providing directly on said substrate surface a support layer;
   (c) providing a mask layer of photolacquer material on said support layer, said mask layer locally masking said support layer, said support layer being characterized by a relatively low adhesiveness for said photolacquer material, with such characteristic remaining substantially unchanged after the hereinafter mentioned heat treatment;
   (d) providing said certain thin layer on said mask layer and exposed parts of said substrate surface;
   (e) heating said mask layer in a certain temperature range such that the chemical reaction capacity thereof is unaffected in a detrimental manner, said temperature range being above the flow limit of said photolacquer but below such temperature at which "cross-linking" of the photolacquer is produced; and
   (f) dissolving said masking layer and removing parts of said certain thin layer disposed thereon, whereby the remaining parts of said certain layer have a desired pattern.

2. A method as in claim 1, wherein said supporting layer is of silicon dioxide.

3. A method as in claim 1, wherein said supporting layer is of aluminum.

4. A method as in claim 1, wherein said supporting layer is of a magnetic material.

5. A method as in claim 1, wherein said heating step is carried out in a temperature range of 100° – 200° C.

6. A method as in claim 1, wherein said certain layer has a thickness of 1–3 microns.

7. A method as in claim 6, wherein said certain layer is provided on said substrate by cathode sputtering.

8. A method as in claim 6, wherein said certain layer is provided on said substrate by vapor deposition.

9. A method as in claim 1, wherein said certain layer has a multilayer structure.

10. A method as in claim 1, wherein said photolacquer layer has a thickness which exceeds the thickness of said certain layer.

11. A method as in claim 1, wherein said photolacquer layer has steep edges.

12. A method as in claim 1, wherein said certain layer is of a metal or an alloy.

13. A method as in claim 1, wherein said certain layer is of an oxide.

14. A method as in claim 1, wherein said certain layer is of a nitride.

15. A method as in claim 1, wherein said certain layer is of a magnetic material.

* * * * *